(12) United States Patent
Roys

(10) Patent No.: US 12,716,147 B2
(45) Date of Patent: Aug. 25, 2026

(54) SYNTHETIC DIAMOND FROM A LEVITATING SUPERSATURATED SOLVENT AT LOW PRESSURE: PROCESS, APPARATUS, AND MATERIAL

(71) Applicant: Cosmic Diamonds LLC, West Chicago, IL (US)

(72) Inventor: Stephen Roys, West Chicago, IL (US)

(73) Assignee: Cosmic Diamonds LLC, West Chicago, IL (US)

( * ) Notice: Subject to any disclaimer, the term of this patent is extended or adjusted under 35 U.S.C. 154(b) by 405 days.

(21) Appl. No.: 18/547,302

(22) PCT Filed: Feb. 21, 2022

(86) PCT No.: PCT/US2022/017166

§ 371 (c)(1),
(2) Date: Aug. 21, 2023

(87) PCT Pub. No.: WO2022/178358

PCT Pub. Date: Aug. 25, 2022

(65) Prior Publication Data

US 2024/0150936 A1 May 9, 2024

Related U.S. Application Data

(60) Provisional application No. 63/152,131, filed on Feb. 22, 2021.

(51) Int. Cl.

| | |
|---|---|
| ***C30B 30/08*** | (2006.01) |
| ***C30B 9/10*** | (2006.01) |
| ***C30B 29/04*** | (2006.01) |

(52) U.S. Cl.
CPC ................ *C30B 30/08* (2013.01); *C30B 9/10* (2013.01); *C30B 29/04* (2013.01)

(58) Field of Classification Search
CPC .... C30B 9/00; C30B 9/04; C30B 9/08; C30B 9/10; C30B 15/00; C30B 15/02;
(Continued)

(56) References Cited

U.S. PATENT DOCUMENTS

| | | |
|---|---|---|
| 3,142,539 A | 7/1964 | Brinkman et al. |
| 3,175,885 A | 3/1965 | Brinkman et al. |

(Continued)

OTHER PUBLICATIONS

"Created Diamonds", ALTR, 2021, www.altr.nyc/created-diamonds/.

(Continued)

*Primary Examiner* — Kenneth A Bratland, Jr.
(74) *Attorney, Agent, or Firm* — Neal, Gerber & Eisenberg LLP

(57) ABSTRACT

Methods and apparatus for synthesizing diamond from a carbon solution are provided. A carbon solution comprising dissolved carbon and liquid solvent is positioned in a levitation volume. Levitation is facilitated by performing the methods in microgravity. The levitation volume can have a dissolution zone and a diamond growth zone at different temperatures, or the temperature of the levitation volume can be adjusted between different periods. Apparatus are provided with one or more levitation generators which define a levitation volume and temperature control systems and devices. Diamond materials having sizes and properties suitable for a variety of applications are also provided.

22 Claims, 8 Drawing Sheets

(58) Field of Classification Search

CPC ......... C30B 15/14; C30B 15/16; C30B 15/20; C30B 15/30; C30B 29/00; C30B 29/02; C30B 29/04; C30B 30/00; C30B 30/04; C30B 30/08; C30B 35/00

USPC .......... 117/11–13, 30, 32–34, 36, 73, 77–79, 117/200, 204, 206, 208, 214, 217–218, 117/901, 928–929

See application file for complete search history.

(56) References Cited

U.S. PATENT DOCUMENTS

| | | | | |
|---|---|---|---|---|
| 3,936,346 | A * | 2/1976 | Lloyd | C30B 15/10 117/900 |
| 4,859,493 | A | 8/1989 | Lemelson | |
| 4,896,849 | A * | 1/1990 | Moynihan | C30B 30/08 244/173.1 |
| 5,476,063 | A | 12/1995 | Nakatani et al. | |
| 5,955,800 | A | 9/1999 | Shearwood et al. | |
| 6,342,195 | B1 | 1/2002 | Roy et al. | |
| 7,061,964 | B2 | 6/2006 | Kawasaki et al. | |
| 9,346,681 | B2 | 5/2016 | Stoneham et al. | |
| 2012/0107212 | A1 | 5/2012 | Taylor et al. | |
| 2013/0217564 | A1 * | 8/2013 | Stoneham | C30B 9/00 501/153 |
| 2019/0152835 | A1 | 5/2019 | Volfson et al. | |

OTHER PUBLICATIONS

"Lab Grades Its Largest CVD Diamond", Rapaport News; https://rapaport.com/news/lab-grades-its-largest-cvd-diamond/?format=pdf, Nov. 2020.

"The Element Six CVD Diamond Handbook", 2016.

Ardon, Troy, et al., "15 Carat HPHT Synthetic Diamond", G&G Lab Notes. (eds. Thomas M. Moses and Shane F. McClure), Gems & Gemology, 54(2): 206-218, 217-218 (2018).

Banerjee, Amit, et al., "Ultralarge elastic deformation of nanoscale diamond", Science 360, (2018), 300-302.

Burton, C., "Artificial Diamonds", Nature No. 1869, vol. 72, (1905), 397.

Catledge, et al., "Nanostructured diamond coatings for orthopaedic applications", Woodhead Publ Ser Biomater., 2013:105-150.

D'Haenens-Johansson, U.F.S., et al., "Near-Colorless HPHT Synthetic Diamonds From AOTC Group", Gems & Gemology; 50(1): 30-45.

Eaton-Magaña , et al., "Observations on HPHT-Grown Synthetic Diamonds: A Review", Gems & Gemology, vol. 53, No. 3, 2017, 262-284.

Glebovsky, Vadim, "Electromagnetic Levitation of Metal Melts", Magnetic Materials and Magnetic Levitation, IntechOpen, 2020.

Hassan, S. A., et al., "Limitation of Silicon Based Computation and Future Prospects", Second International Conference on Communication Software and Networks, Singapore, 2010, 559-561.

Li, G. X., et al., "Scaling law for diffusion coefficients in simple melts", Phys. Rev. B, 71, 094209, Mar. 30, 2005, 7 pages.

Patel, A. R., et al., "Overgrowths on Diamond at Atmospheric Pressure", Journal of Crystal Growth, 46, 1979, 706-708.

Rattanapun, et al., "A Series-Resonant Inverter for Levitation Melting Application", International Electrical Engineering Congress, Dec. 23, 2019, 1-4.

Slack, Glen A., "Thermal Conductivity of Pure and Impure Silicon, Silicon Carbide, and Diamond", J. Appl. Phys. 35, No. 12, 1964, 3460-3466.

Sung, Chien-Min, et al., "Reactivities of Transition Metals With Carbon: Implications to the Mechanism of Diamond Synthesis under High Pressure", International Journal of Refractory Metals and Hard Materials, 15(4): 237-256, 1997.

Wang, X., et al., "Carbon Phase Diagram from Ab Initio Molecular Dynamics", Phys. Rev. Lett. 95, 185701 (2005).

Yolshina, L. A., et al., "Diamond synthesis in aluminum matrix in molten alkali-halide at ambient pressure", Diamond & Related Materials, 55: 1-11,(2015).

CVD/HPHT Polished Loose Synthetic Diamonds, Lab Grown Diamond. (2020). Retrieved from Alibaba: https://www.alibaba.com/product-detail/CVD-HPHT-Polished-Loose-Synthetic-Diamonds_60631391501.html.

* cited by examiner

SYNTHETIC DIAMOND FROM A LEVITATING SUPERSATURATED SOLVENT AT LOW PRESSURE: PROCESS, APPARATUS, AND MATERIAL

CROSS-REFERENCE TO RELATED APPLICATIONS

This application is a US national stage entry of PCT/US22/17166, filed Feb. 21, 2022, which claims priority to and benefit of U.S. Patent Application No. 63/152,131, filed on Feb. 22, 2021, the contents of which are incorporated herein by reference in its entirety.

TECHNICAL FIELD

The present disclosure relates, in general, to processes and apparatus for synthesizing diamonds, and to synthesized diamond materials.

BACKGROUND

Synthesizing diamond is very difficult because graphite is the thermodynamically stable solid form of carbon at pressures below about 1 gigapascal, as illustrated in FIG. 1 (Wang, 2005). However, once diamond has been formed, it remains as diamond at moderate temperatures. This is because diamond is metastable, meaning that diamond requires a significant amount of activation energy to degrade into the thermodynamically stable form, graphite. Such activation energies are usually only overcome at high temperatures. For these reasons, diamonds are thought to be "forever" in jewelry applications.

In order to achieve high pressures for diamond synthesis, many companies have used expensive diamond presses operating at high temperatures. Such diamonds and methods are commonly called high pressure, high temperature (HPHT or HTHP) and were first performed by the Swedish company ASEA in 1953 (Ulrika F. S. D'Haenens-Johansson, 2014). This HPHT process operates on one or a combination of the following two principles: (1) At the same pressures and temperatures, carbon solubility of graphite into a solvent is greater than carbon solubility of diamond into the same solvent; (2) Solvents saturated with carbon from dissolving diamonds at a high temperature become supersaturated to diamond growth as the temperature of the solution is reduced.

In a HPHT process, utilizing only principle 1, a pressurized chamber of hot solvent is maintained at a uniform temperature. A diamond seed is placed on one end of the chamber while graphite is placed at the other end of the chamber. Since the carbon solubility of the graphite in the solvent is greater than the carbon solubility of the diamond in the solvent, the concentration of carbon is higher near the graphite than near the diamond. Therefore, carbon diffuses from the graphite surface to the diamond surface where the excess carbon from the graphite induces carbon supersaturation with respect to diamond. Therefore, diamond precipitates onto the diamond seed from the supersaturated solution. In FIG. 3, this is depicted by the arrow from C to D.

In a HPHT process, using only principle 2 one end of a pressurized chamber filled with solvent is maintained at a higher temperature than the other end. Small diamonds are on the end of the chamber that is maintained at the higher temperature while a seed diamond is on the opposite end at a lower temperature. On the hot end of the chamber, carbon is saturated with respect to diamond. However, on the other end of the chamber, carbon becomes supersaturated with respect to diamond as the higher concentration of carbon on the hot end diffuses to the cold end. The supersaturation induces diamond growth onto the seed diamond. This is graphically depicted by the arrow from A to D in FIG. 3.

In an HPHT process, using a combination of both principles 1 and 2 graphite is placed at one end of a chamber filled with a solvent. A diamond seed is kept at a cooler temperature on the opposite end of the chamber utilizing principle 2, while the graphite is maintained at a higher temperature. A higher concentration of carbon is achieved near the graphite surface than would be achieved with diamond. Then, the temperature gradient between the graphite and diamond seed, due to principle 1, creates a higher supersaturation at the growing diamond surface. Therefore, higher growth speeds may be achieved as carbon diffuses from the graphite, through the solvent, to the diamond surface where the supersaturated carbon grows as diamond. This process is depicted by the arrow from B to D in FIG. 3 (Chien-Min Sung, 1997).

HPHT diamonds sometimes have nitrogen impurities in the 100-300 ppm range, and can contain macroscopic inclusions from the solvent in which the diamonds grew. However, a nitrogen getter may be added to the solvent which has a strong affinity for nitrogen, such as aluminum (Al), titanium (Ti), zirconium (Zr), hafnium (Hf) or others. However, the nitrogen getter may also form a carbide in the solvent, which also may cause inclusions composed of the solvent. Other elements like copper may be added to prevent formation of such carbides. Such solvents with a nitrogen getter and anti-carbide forming agent may produce diamonds with nitrogen impurities less than 1 ppm, and without solvent inclusions. (Ulrika F. S. D'Haenens-Johansson, 2014)

The diamond presses used in the HPHT process are expensive to operate at such high pressures and temperatures, and high quality HPHT diamonds may also take a long time to grow. Therefore, diamonds grown by HPHT processes have been limited to sizes less than 16 mm (Sally-Eaton Magaria, 2018).

During their attempts to improve the HPHT method, scientists have found catalysts that speed up diamond growth from a supersaturated solution. Graphite is a planar layer of carbon atoms consisting of sp2 bonds to neighboring carbon atoms. Diamond is a 3D lattice of carbon atoms consisting of sp3 bonds to neighboring carbon atoms. 3D graphite crystals are formed by layers of planar sp2 carbon layers stacked on top of each other. These graphite crystals may be "puckered" by catalysts with the right size and electronic configuration to stabilize the conversion to the sp3 diamond lattice. Such "puckering," or sp3 diamond favoring catalysts have been analyzed and ranked by their ability to catalyze graphite "puckering" into the diamond form, and also diamond growth (Chien-Min Sung, 1997). Such catalysts may be useful for any process of diamond growth from a carbon supersaturated liquid.

In the early 2000's, researchers from Penn State University revitalized previous work on the chemical vapor deposition (CVD) method for diamond growth technology. The CVD method the researchers developed grows diamonds from a reactive gaseous mixture (See U.S. Pat. No. 6,342,195, 2002). Diamonds produced by this CVD technique are commonly called CVD diamonds, which can be very pure. But CVD diamonds require very long time periods to grow as monocrystalline diamonds. For example, high quality monocrystalline CVD diamond growth rates may be limited to about 0.003-0.015 millimeters per hour (ALTR, 2018). Additionally, polycrystalline diamond grows on the edges of the monocrystalline diamond, which tends to induce stress cracks preventing further growth into larger diamonds (Element Six Technologies, 2015). Therefore, CVD diamond sizes have been limited to about 13 carats (Rapaport News, 2020).

Early evidence that diamond may be grown at atmospheric pressure from a carbon supersaturated liquid emerged beginning in 1905 when water was added to a lead and calcium mixture saturated with carbon. The water removed calcium from the lead in the form of a calcium hydrate. Once calcium was removed from the lead, carbon became supersaturated in the lead solvent. When this process was performed at lower temperatures, the carbon supersaturation induced nucleation of graphite. However, at higher temperatures, the carbon supersaturation induced nucleation of small diamonds as depicted in FIG. 5. (Burton, 1905) While this method of diamond production is a great proof of concept for the mechanism of diamonds nucleating from a carbon supersaturated liquid, this method is not capable of producing large diamonds. For a long time, the scientific community rejected Burton's work on the grounds of diamond not being stable under those low pressure conditions. The scientific community favored the HPHT process because it showcased scientists' ability to calculate the range of stability for diamond. For this reason, the scientific community did not seek to improve or replicate Burton's experiments until many decades later when it was confirmed to be true (Sebba, 1985).

In an attempt to grow synthetic diamonds at atmospheric pressure, in 1960, Brinkman filed two patents describing a method to grow diamonds from a carbon supersaturated solution at atmospheric pressure (U.S. Pat. No. 3,142,539, 1964) (U.S. Pat. No. 3,175,885, 1965). These methods heat molten metal in a dissolution chamber to dissolve graphite. Then, the heated solution is cooled and passed over a seed diamond so that the solution is carbon supersaturated with respect to diamond, inducing diamond growth on the seed diamond. This method leads to slow growth rates reported up to about 2.5 millimeters per day. The process is also expensive as the liquid solvent must be heated and then cooled over and over again while little product yield is returned.

In Brinkman's experiments, there are two mechanisms that could be limiting the rate of diamond growth: (1) diffusion of the bulk carbon to the surface of the growing diamond; and (2) reaction rate of diamond growth once the carbon has diffused to the diamond surface.

If diffusion of the bulk carbon to the surface of the growing diamond is the limiting factor, increasing carbon concentration in the liquid would increase growth rates. However, since the process is run with container walls, increases in carbon supersaturation from higher concentrations will only lead to more deposition onto chamber walls before the solution reaches the diamond surface. If reaction rate of diamond growth is the limiting factor, increasing carbon concentrations, and therefore higher levels of supersaturation will also increase reaction rates.

However, for the same reason that this process is run inside a container and graphite will deposit onto the walls, higher supersaturations are unlikely.

It has long been known that nickel catalyzes diamond growth in the carbon supersaturated conditions of the HPHT process. For this reason, scientists were shocked in 1979 when they discovered diamond growing on a diamond surface in a molten melt of nickel. The scientists hypothesized that the diamonds grew as carbon was dissolved in the molten metal before nucleating on top of the same surface (Patel, 1979). While this discovery was a good proof of concept for the low pressure carbon supersaturated diamond growth process, this research provided neither a method to introduce additional carbon into the system, nor an ideal apparatus for mass production, nor a method to increase growth rates.

In 2015, diamond was synthesized from a molten solution in the presence of oxygen. In a set of experiments, a carbide solute is dissolved into a molten aluminum solvent, sometimes among other compounds or elements. The carbide would react with oxygen at the surface of the carbide-aluminum solution to release monatomic carbon back into the solution. The carbon atoms became supersaturated, nucleated, and grew as small diamonds (Yolshina, 2015). While this process offers another good proof of concept for the carbon supersaturated liquid growth mechanism, it is limited in practice. The free carbon will be available near the surface of the liquid. However, the carbon will recombine with the carbide forming element inside the liquid. It is not clear how this process might be scaled up to mass production. And, it is also not clear how this process could create large diamond materials.

U.S. Pat. No. 9,346,681 describes a similar process to that described by Brinkman in which liquid metal circulates horizontally with a carbon dissolution zone and a cooler diamond growth zone. The process also injects hydrogen plasma in the growth zone to prevent graphite formation. This process still is expensive because it continuously heats and cools the liquid metal. Additionally, large carbon supersaturations may not be possible due to nucleation on the walls of the apparatus. And, there seems to be no experimental proof to confirm the claims.

U.S. Pat. No. 4,485,080 describes a process whereby a carbon containing alloy is melted and rapidly quenched before heating again to precipitate diamond. Then, the alloy is treated again to remove the diamond powder. This requires many steps and would be much more energy and time efficient to perform diamond growth directly from the liquid metal. And, there is not provided a means to make large diamonds from this process.

Diamond is a very versatile material with very unique properties. These properties are high thermal conductivity, high strength, elasticity, high bandgap semiconductor, chemical hardness, radiation hardness, biocompatibility, and transparency among others.

At room temperature, diamond's thermal conductivity is about 2,200 W/m-K (Slack, 1964) which is about 10 times that of aluminum which is commonly used in applications requiring high thermal conductivity. Therefore, diamond is commonly used in small applications that require heat sinks such as lasers, and computer chips. However, it is not used in large heat sink applications because size, cost, and machinability are limiting factors.

Its strength gives diamond widespread use in the cutting industries. Diamond will decompose into graphite at high temperatures above about 1500° C. (Davies, 1972). However, in cutting applications with coolant supplied to the cutting surface, diamond is widely used as an abrasive in drilling, mining, and other cutting industries while it is also used as a protective coating on high wear devices.

Interestingly, diamond is one of the most elastic materials (Banerjee, 2018), making it ideal for micro scale machines that require deformation, such as, for example, a valve in a microelectromechanical (MEM) device.

Diamond is also a great material for the semiconductor industry. Diamond's very large band-gap can lead to lower power losses in high power electronics. Diamond transistors can also operate at high frequencies, and are approximately inert to the radiation in space. Therefore, although it may take a long time to shift the consumer industry to diamond based microelectronics, niche areas such as power electronics may adopt diamond based technology more readily. Also, diamond transistors can switch while 5 times hotter, and transfer heat away 22 times faster than silicon-based technologies, making them potentially much improved compared to silicon based technology because heat generation becomes a limiting factor in silicon-based technologies (Hassan, 2010).

Diamond is also widely used as a gemstone in the jewelry industry. And, although they are in a metastable form and would readily convert to graphite at higher temperatures, they are considered forever because they are so hard, and under normal pressures and temperatures, diamond will last many lifetimes.

Diamond's biocompatibility also opens up a wide range of applications. Carbon, the element that diamond is composed of, is extremely biocompatible. Therefore, diamond's strength and biocompatibility leads to uses as a bone replacement material (Catledge, 2013).

Furthermore, diamond is chemically inert to a wide host of chemicals, and some levels of radiation making it useful in chemical sensing, harsh environments, and so many other applications. E.g. in a nuclear meltdown, diamond based computer chips may operate longer than silicon based chips allowing more safety features to automatically trigger.

Other methods, apparatus, materials, systems, features and advantages of the invention will be or will become apparent to one with skill in the art upon examination of the following figures and detailed description. It is intended that all such additional systems, methods, apparatus, features and advantages be included within this description, be within the scope of the invention, and be protected by the accompanying claims.

SUMMARY

As one aspect of the present invention, a method of synthesizing diamond is provided. The method comprises levitating a carbon solution comprising dissolved carbon and liquid solvent. In some embodiments configured for a continuous process, the carbon solution comprises a dissolution zone and a diamond growth zone, and the dissolved carbon diffuses from the dissolution zone to the diamond growth zone. The method also comprises controlling temperature of the carbon solution so that the liquid solvent becomes saturated or supersaturated with dissolved carbon. In embodiments where the carbon solution comprises more than one zone, the method can comprise controlling temperature in the diamond growth zone so that it is lower than the temperature of the carbon solution in the dissolution zone, so that the liquid solvent in the growth zone becomes saturated or supersaturated with dissolved carbon. The method also comprises nucleation and growth from the dissolved carbon in the liquid solvent to form a diamond precipitate.

As another aspect of the present invention, an apparatus is provided for synthesizing diamond from a carbon solution comprising dissolved carbon and liquid solvent. The apparatus comprises a levitation generator configured to apply levitating forces which define a levitation volume. The levitation volume comprises a dissolution zone and a diamond growth zone. The levitation generator can be a Lorentz force generator, such as an induction coil. The apparatus also comprises a temperature control device positioned to adjust the temperature of the levitation volume or one or more zones thereof. The temperature control device can include a heat exchanger, and/or other temperature controlling devices. In some embodiments, the apparatus also includes a carbon source feed device at an end of the levitation volume, and/or a diamond withdrawal device at another end of the levitation volume.

As yet another aspect of the present invention, novel diamond materials are provided. For example, the present disclosure enables synthesis of a diamond cylinder having a diameter and a length greater than 16 mm.

These and other features and advantages of the present methods and materials will be apparent from the following detailed description, in conjunction with the appended claims.

BRIEF DESCRIPTION OF THE DRAWINGS

The present invention can be better understood by referring to the following figures. The components in the figures are not necessarily to scale, emphasis instead being placed upon illustrating the principles of the present invention.

DETAILED DESCRIPTION

Figure 2:
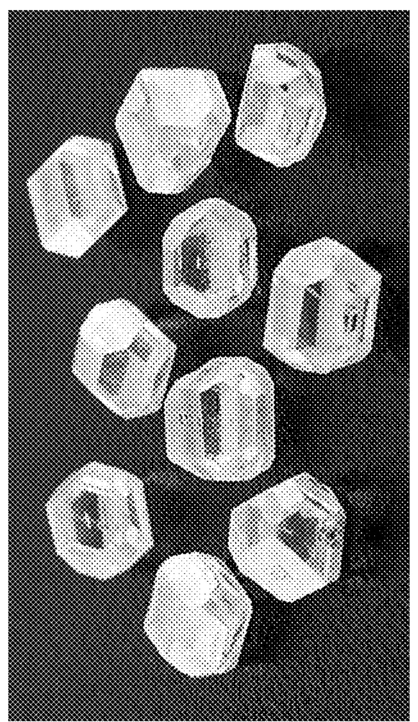
FIG. 2 is a photograph of synthetic diamonds produced by a HPHT method.
Figure 1:
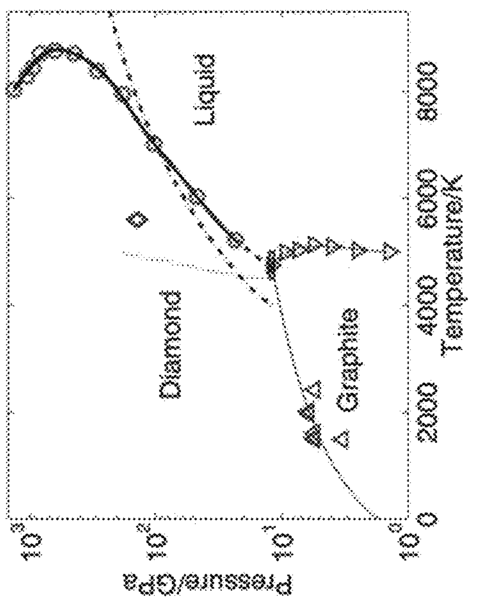
FIG. 1 is a phase diagram of carbon.
Figure 4:
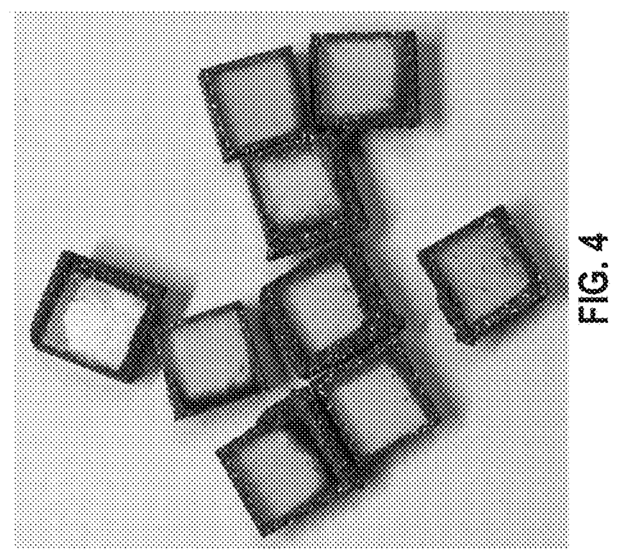
FIG. 4 is a photograph of synthetic diamonds produced by a CVD method.
Figure 5:
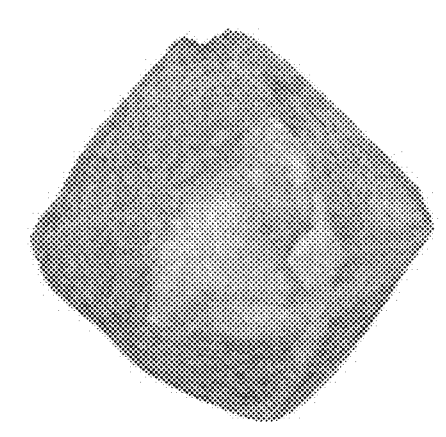
FIG. 5 is a photograph of a small diamond grown from a carbon-supersaturated lead solution after removing calcium from the lead using steam.
Figure 3:
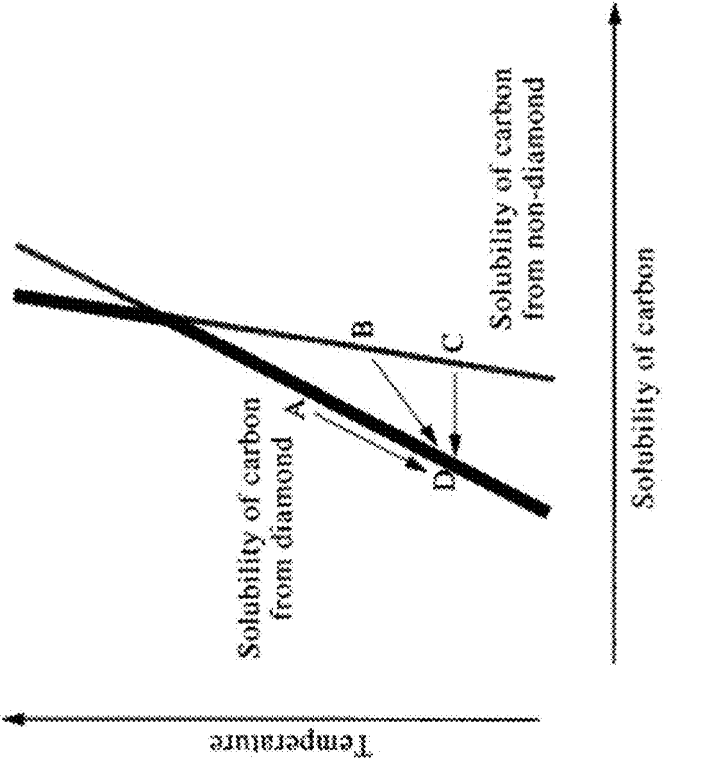
FIG. 3 is a diagram illustrating HPHT diamond growth routes.

The present invention provides several improvements and overcomes many of the disadvantages of previous approaches to synthesizing diamond. Among the objects and advantages of the present invention are production of diamonds with one or more dimensions of 16 mm or larger; production of diamonds at a low pressure; production of diamonds in a continuous process; and/or production of diamonds without significant energy costs.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

"Levitating" as used herein means a material is suspended without solid-surface to liquid-surface contact to support its mass. Aerodynamic levitation means supplying a gaseous flow or mass at a pressure sufficient to counter the force of gravity; such pressure may be lower than pressures used in HPHT processes.

The present methods can be performed in microgravity, reduced gravity, or earthbound gravity. "Microgravity" refers to an environment where the force of Earth's gravity is significantly reduced or countered, such as in orbit around the earth or in outer space. For example, an object in orbit experiences a reduced gravitational force as a result of being in a state of free fall; the International Space Station (ISS) orbits about 400 km above the Earth and provides an environment for experiments on the effects of microgravity. Earth-centered orbits at altitudes of 2,000 km or less can provide microgravity environments. A microgravity environment can be created using a drop tube, a sub-orbital spaceflight, or an aircraft following a parabolic flight path relative to Earth.

"Reduced gravity" refers to an environment where gravitational force is reduced or countered, such as underwater. "Earthbound gravity" refers to an environment where an object experiences Earth's gravitational force, or approximately 9.8 m/s 2.

As used here, the terms "substantial" or "substantially" mean to within acceptable limits or degree to one having ordinary skill in the art. For example, "substantially free" of a substance means that one skilled in the art considers the remaining substance acceptable. "Approximately" and "about" mean to within an acceptable limit or amount to one having ordinary skill in the art. For example, the term "about" generally refers to plus or minus 10% of the indicated number, and "approximately the same" means that one of ordinary skill in the art considers the items being compared to be the same.

As used herein, the terms "a," "an," and "the" include both singular and plural referents, unless the context clearly dictates otherwise. Thus, for example, "a generator" includes one generator and plural generators.

As one aspect of the present invention, a method for diamond synthesis is provided, which has many embodiments. The present methods typically comprise levitation of a carbon solution comprising dissolved carbon and liquid solvent; and controlling temperature in the levitated carbon solution to induce carbon supersaturation with respect to diamond growth.

More particularly, the present methods comprise levitating a carbon solution comprising dissolved carbon and liquid solvent. The levitated carbon solution will occupy a levitation volume. The carbon solution can be maintained at a substantially uniform temperature or concentration, or it can be configured to form various zones having different temperatures, concentrations of dissolved carbon, and/or other properties, or at different time periods, the carbon solution can have different temperatures, concentrations of dissolved carbon, and/or other properties. In some embodiments, the carbon solution comprises a dissolution zone and a diamond growth zone. The dissolved carbon diffuses from the dissolution zone to the diamond growth zone. The method also comprises controlling temperature of the carbon solution in the diamond growth zone so that it is lower than the temperature of the carbon solution in the dissolution zone. The liquid solvent in the growth zone becomes saturated or supersaturated with dissolved carbon. The method also comprises nucleation and growth of the dissolved carbon from the liquid solvent in the diamond growth zone or from the bulk liquid to form a diamond precipitate.

In the presently preferred embodiments, the carbon solution is levitated in a microgravity environment. When the method is performed in microgravity, the levitating force applied from one or more levitation generators may be used to confine the carbon solution within a levitation volume. In other embodiments, the present method is performed in reduced gravity or Earthbound gravity. The carbon solution can be formed by dissolving a carbon source in the liquid solvent before, during or after the levitating step. For example, the carbon solution can be formed by placing a metal solvent in solid form in a levitation volume, and increasing the temperature of the liquid solvent, or one or more zones of the liquid solvent. For example, the temperature can be increased by radiative heating from a resistive heating element placed near the metal solvent; and introducing the carbon source to the molten solvent. An alternating magnetic field can be applied by an inductor applying a Lorentz force for levitation.

As another aspect of the present invention, several apparatuses for synthesizing diamond are provided. The presently provided apparatus are examples and not meant to encompass all possible manners in which the present methods may be achieved. Furthermore, the present apparatus may be used in manners other than the present methods. An exemplary apparatus for synthesizing diamond comprises a levitation generator configured to apply levitating forces. The applied levitating forces define a levitation volume. The apparatus also comprises a temperature control device positioned to adjust the temperature of the levitation volume, or of one or more zones within the levitation volume.

Suitable levitation generators include Lorentz force generators, acoustic force generators, and aerodynamic force generators. The Lorentz force generator can be an inductor. In some embodiments, the Lorentz force generator comprises a plurality of coils or electrodes, such as an induction coil. For instance, the levitation generator can comprise a coil assembly, such as a coil assembly comprising at least two coils, which coils are substantially concentric and arranged so that one of said coils is located inwardly of another of said coils. In some embodiments, a first coil and a second coil are electrically connected in series or in parallel. In some embodiments, an inductor produces a Lorentz force in a direction opposing another levitation generator. In some embodiments, the levitation generator comprises at least three pairs of levitation generators, and the pairs are positioned on three mutually perpendicular axes.

The present apparatus also includes a temperature control device. The temperature control device can include a heater, heat exchanger, or other temperature changing device to control the temperature of the dissolution zone and/or the diamond growth zone and/or other locations within the levitation volume and/or the growing diamond. A thermocouple, or an optical, radiation, or color pyrometer may be used to sense temperatures and feed that information to a control system to change temperatures within the system.

The present apparatus can also include other devices to facilitate or expand the present techniques of diamond synthesis from dissolved carbon. For instance, an apparatus can also include a carbon source feed device positioned at an end of the dissolution zone, and/or a diamond withdrawal device positioned at an end of the diamond growth zone. The carbon source feed device and a diamond withdrawal device can include robotic arms, conveyors, platforms, or other components. As another example, a system for manufacturing diamond wafers can include a diamond synthesizing apparatus as described herein, and a cutting laser positioned to slice wafers or ingots from a larger diamond ingot or cylinder recovered from the diamond growth zone.

In some embodiments, the present apparatus comprises a solid solvent support for holding the solvent in solid form before and/or after it is levitated and melted. The solid solvent support may have a convex surface to receive a spherical solid, or it may have a reservoir for receiving liquid material.

In some embodiments, the present apparatus comprises a container in which the levitating elements and the heater are contained. The internal walls of the container (those facing the levitation volume) should be able to withstand the temperatures and pressures at which the present methods are performed (for example, temperatures of 2500° C. or higher, and pressures of 100 kPa or higher).

As another aspect of the present invention, novel diamond materials are provided which are suitable for use in multiple industries. An exemplary novel diamond material is a diamond cylinder having a diameter and a length, though the novel diamond material can be provided in a variety of other geometries having a length. In some embodiments, the diamond material has a length greater than 16 mm, or at least 20 mm, or at least 40 mm, or at least 100 mm, or at least 500 mm, or at least 1 meter. The diamond cylinder can also have a diameter of at least 16 mm, or a cross-sectional area of at least 200 $mm^2$. Any of the foregoing lengths, diameters and/or cross-sectional areas can be combined to more particularly define a diamond material. A diamond cylinder has a substantially cylindrical shape over a majority of the material, but need not be perfectly circular and/or cylindrical.

Levitation of A Carbon Solution

The present invention comprises steps and components for levitating a carbon solution. One or more levitation generators may be positioned around a desired levitation volume. The levitation force required to levitate a carbon solution can be calculated. The levitation force can be adjusted to increase or decrease the levitation volume so that when the levitation generators are in use, they define a levitation volume (that is, the volume in which a material will be levitated).

Various embodiments of the present methods employ physical phenomena related to electromagnetic levitation and melting. In electromagnetic levitation and melting, a conductive metal may be suspended against a gravitational force without solid-surface contact. The force that opposes gravity in such a system is called a Lorentz force. The Lorentz force is a result of magnetic repulsion.

A magnetic field is produced whenever current flows through a conductor. The magnetic field has concentric isolines about the axis of a straight wire. However, these wires may be configured in a way that produces a net magnetic field with isolines pointing mainly up or down for a given spatial volume. In such a configuration, the direction of the magnetic field lines (up or down) is determined by the direction of the flow of current. When flow of current in the wires change, the magnitude of the magnetic field produced by the electric current changes. When a changing magnetic field passes through a conductor, an electrical current is induced in the conductor. Therefore, this physical phenomena is called induction. This induced electrical current creates a magnetic field of its own that opposes the changing magnetic field. Since opposite magnetic fields repel each other, the conductor's opposing magnetic field creates an opposing force called the Lorentz force.

In the case of electromagnetic levitation, this Lorentz force levitates a conductive material. And, additionally, the current induced in the conducting metal creates heat from the electrical resistance of the material. Therefore, the conductive material may melt from resistive heating, and levitate from the opposing magnetic field induced in the conductor by the changing magnetic field.

Figure 11:
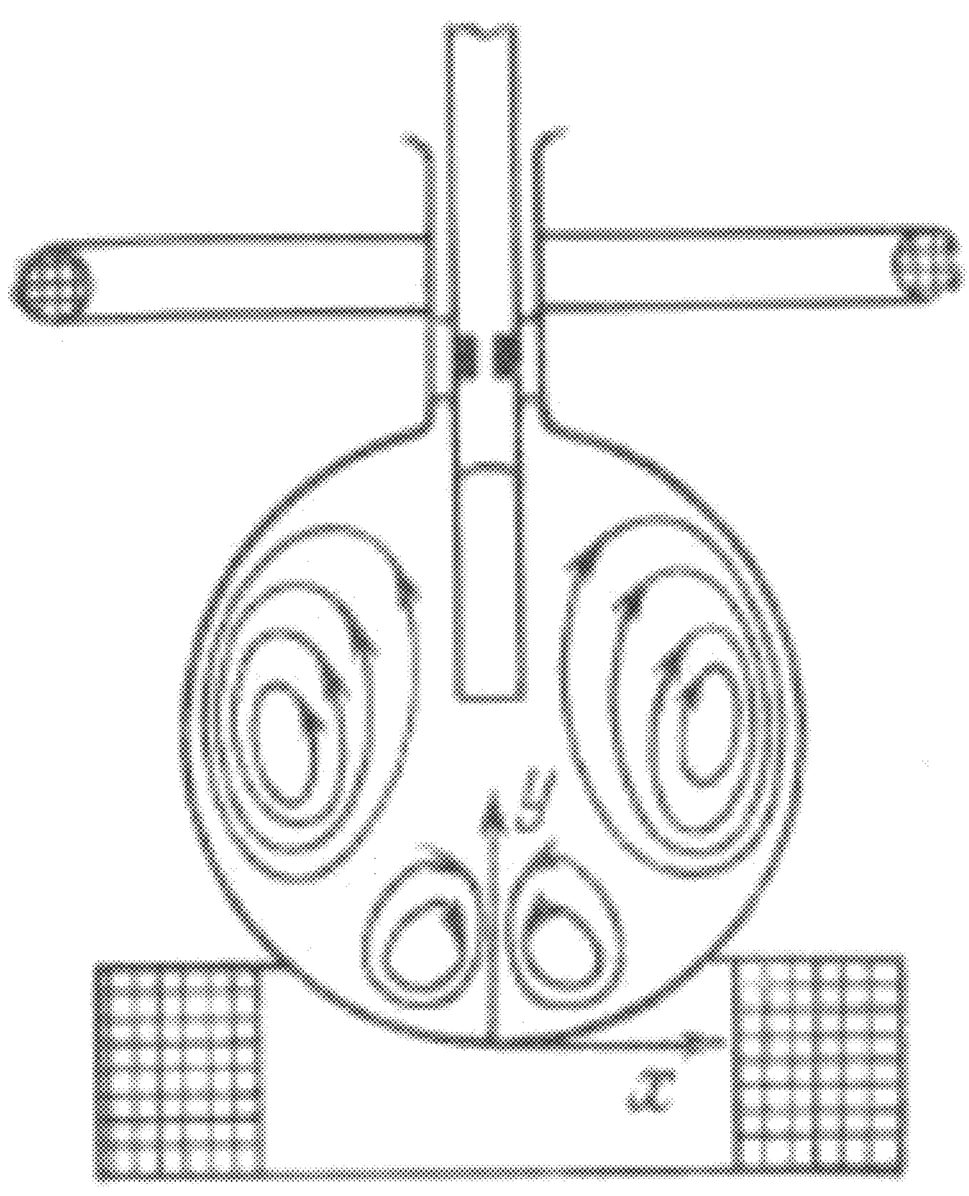
FIG. 11 illustrates a mixing pattern from the Lorentz force in a levitating liquid.

The force on a levitating liquid from the electromagnetic levitation and melting process creates a mixing effect in the levitating liquid. This happens because the Lorentz force acts mainly on the surface of the levitating conducting material. And, therefore, the surface of the levitating liquid is sheared and mixed around as the convection from the Lorentz force creates an approximately homogenous liquid with respect to temperature, and composition. This mixing pattern is shown in FIG. 11 (Glebovsky, 2020) where the motion inside the liquid is represented by the lines and arrows showing circular-like eddy currents within the molten metal.

During electromagnetic levitation and melting, repulsive forces generated by the interaction between the inductor and conductor may be tuned with the amplitude of the current supplied. Therefore, larger amplitudes correspond to higher Lorentz forces, an lower amplitudes correspond to lower Lorentz forces. And, since a Lorentz force responds to a changing magnetic field, the current must be operating in an alternating current manner. The frequency at which the current alternates may be fine-tuned to adjust the resistive heating provided through induction to the conductor. Therefore, as frequency increases, heating power increases, and as frequency decreases, heating power decreases.

In a levitation volume, the x, y, and z axes may be defined where the z passes through the centerline of the growing diamond cylinder while x and y are orthogonal to each other and the z axis where the origin is near the center of the solution. The x, y, and z position of the solution may be controlled in many ways including acoustic, electromagnetic, and gas flow methods. In the preferred method, the x, y and z position of the solution will be controlled using opposing electromagnetic induction coils.

In some embodiments, it is preferable to levitate the solvent in the microgravity of space or low earth orbit. In some embodiments, the microgravity-based method is preferable due to the following two reasons: (1) Low cost levitation of large masses of solvent, and (2) Continuous processing due to absence of gravitationally driven convection.

First, massive amounts of solvent may be levitated in the microgravity of outer space without expending significant amounts of energy. Relative to earth-based methods of acoustic, electromagnetic, gas counterflow, or similar methods, microgravity-based methods are less costly as earth-based methods must all resist the force of gravity for the periods of time that diamond growth requires. Low cost levitation in space allows larger size diamonds to be produced because on earth, it becomes too costly to grow large diamonds from large liquid melts that are very massive.

The microgravity-based methods enable continuous diamond synthesis. In a continuous process, a carbon source is continuously introduced into the liquid solvent in the dissolution zone while the liquid solvent is levitating, and/or the diamond precipitate is continuously recovered from the diamond growth zone. On earth, gravity forces colder, more dense fluids towards the center of the earth while hotter fluids rise, creating a natural mixing effect as the solvent is heated. Such mixing prevents a levitating solvent from maintaining a permanent hot and cold end. However, in the microgravity of outer space or low earth orbit, gravity does not force cold solvent down and hot solvent up. Rather, in low earth orbit, the levitating solvent is in a freely falling state. This allows continuous processing by keeping a hot dissolution zone while maintaining a cooler diamond growth zone at the same time in the levitated volume of carbon solution. Thus, carbon may continuously be fed into the liquid solvent at the hot end of the solvent, and diamond may be continuously removed from the cooler end of the solvent.

In some embodiments, the present methods are performed under earthbound gravity, which may be especially desirable for research and development. In earthbound methods, the liquid solvent or the carbon solution can be levitated by levitation generators that apply Lorentz force, acoustic force, or aerodynamic force (such as by using gas counter-flow). In earthbound methods, due to the mixing effects of gravity, it may be easier to perform the diamond synthesis method as a batch process. Generally, in a batch process, substantially all of the liquid solvent is subjected to the same temperature at a given time period, though there may be some minor fluctuations. First, the liquid solvent is heated, and a carbon source is added to the liquid solvent to form a dissolved carbon solution; then the carbon solution is cooled to induce supersaturation of carbon, which forces diamond growth on a seed diamond. In batch operation, this process repeats until the desired diamond size is achieved. This makes a batch process more costly in energy due to repeated heating and cooling of the liquid solvent, and this batch process also requires more time because diamond is not continuously growing.

A carbon source may be added into the liquid solvent to form the solution. Suitable carbon sources include graphite, metal carbides, or any other carbon containing material in solid, liquid, powder, or other forms. Preferably, the carbon source would be introduced into the solvent in a dissolution zone to localize the high carbon concentration within the levitated liquid solvent to allow continuous processing as discussed. However, the carbon may be added and mixed throughout the liquid solvent in a batch processing method. In some embodiments, the carbon source is fed to the liquid solvent by a carbon source feeder, which may be a robotic arm, a conveyer, a platform, or other device.

The present methods and apparatus can employ one or more temperature control devices to form the carbon solution and/or to induce carbon supersaturation with respect to diamond growth. Heat may be added during dissolution of carbon into the entire levitating solution for batch processes, or only near the dissolution zone for the preferred continuous process. This heating may be achieved via radiation coils, induction, energy beams, or other devices. In some embodiments, radiative heating is provided around the levitating solvent from resistive heating elements. In some embodiments, inductive heating elements are used, such as by arranging induction coils around the levitating solvent. Other approaches to supplying and controlling the application of heat to the levitating solvent include heating by photonic means, or indirect heating from a plasma source. Cooling of the carbon solution to induce supersaturation with respect to diamond growth may be performed on the bulk liquid solution for batch processing or near a diamond growth zone for continuous processing. Such cooling may be achieved by a temperature control device influencing radiative, convective, or another heat transfer phenomena. E.g. Radiative heat transfer away from the hot liquid solvent may be sped up by using a liquid or gas cooled heat exchanger. Such heat exchangers may be placed near the carbon solution's surface, the solution-diamond interface, or around the growing diamond being withdrawn from the solution in the continuous process among others.

In some embodiments, the temperature control device comprises a temperature sensor, such as a thermocouple or pyrometer, positioned near the levitation volume. The temperature measurement is used to determine the temperature at desired areas of the levitated solvent or solution. A temperature signal from the temperature sensor(s) is used to control the power supplied to heaters or coolers affecting the levitation volume or a zone thereof, thus allowing for direct temperature control of the zone. This allows different zones of the levitating solvent to be heated or cooled to different temperatures. Furthermore this allows the temperatures of the dissolution and growth zones to be kept substantially different, thereby driving the thermodynamics of diamond growth.

The present methods and apparatus can employ the inserting of a seed diamond at a liquid solvent surface in the diamond growth zone, and precipitating the dissolved carbon onto the seed diamond. Diamond growth can be facilitated by inserting a diamond seed crystal just below the levitated solution's surface in the cooler diamond growth zone. A diamond seed can have a size and shape which influences the size and shape of the diamond precipitate which grows on it. In some embodiments, a seed diamond is at least partially immersed in the carbon solution in the diamond growth zone such that the dissolved carbon is precipitated onto the seed diamond. This results in the growth of this seed diamond into a larger diamond. The depth to which the seed crystal is submerged under the meniscus of the carbon solution is preferably low. For example, the depth may be less than 50 mm, or less than 10 mm, or less than 2 mm below the meniscus to the top of the seed diamond.

The supersaturated carbon precipitates as diamond onto the diamond seed's growing surface, and the diamond seed can be pulled from the levitated solution as a diamond precipitate grows and extends from it. Thus, the diamond precipitate can be withdrawn or otherwise recovered by a recovery device at or near the levitation volume. In some embodiments, the present methods and apparatus include one or more devices for withdrawing a diamond material from the growth zone, such as a robotic arm or conveyer system.

Diamond growth is an exothermic reaction. Therefore, growth rate may be controlled by the cooling rate of the diamond precipitate being withdrawn from the carbon solution. If the heat from the exothermic reaction of growth is not removed, the diamond growth zone will heat up and supersaturation will no longer exist with respect to diamond precipitation. Accordingly, in some embodiments, a heat exchanger or other cooling device is positioned at or near the diamond growth zone, without contacting the levitated solution.

Many other diamond growth methods may be used within the purview of the same process. For example, one or more diamond seed crystals may be inserted into the bulk liquid and allowed to grow into larger diamonds before removal from the levitating liquid. Homogenous diamond nucleation may also be induced by decreasing the temperature of the carbon solution so that the energy barrier to critical diamond size is overcome. In homogeneous diamond nucleation and growth, diamond nuclei will form without a seed diamond.

In some embodiments, the liquid solvent and/or the carbon solution are subjected to an inert atmosphere. An inert atmosphere may be achieved preferably by passing an inert gas such as argon into the chamber where diamond is growing. Gases such as nitrogen, oxygen or others may cause problems by entering the liquid and contaminating the growing diamond lattice. However, in some applications such as microelectronics, some contaminants may be added to dope the resulting diamond material. On earth, a vacuum may be used to evacuate the chamber before flowing argon into the chamber. If the process is performed in outer space, a valve may be used to evacuate the chamber into the vacuum of space while argon or another inert gas may repressurize the chamber. Additionally, the process may be performed under vacuum conditions provided that enough pressure remains to prevent the liquid from boiling.

In some embodiments, the present method is performed at a moderate pressure of at least 10 Pa, or at least 50 Pa, or at least 100 Pa, or at least 500 Pa, or at least 1 kPa, or at least 10 kPa, or at least 50 kPa; in some embodiments, the moderate pressure is at most 1000 kPa, or at most 500 kPa, or at most 250 kPa, or at most 150 kPa; or at most 125 kPa; or at most 100 kPa; it is contemplated that any of the foregoing pressure values can be combined to form a range of desirable moderate pressures. Preferably the pressure is approximately or below 100 kPa. Alternatively, the present method can be performed at high pressures greater than 150 kPa, or greater than 1000 kPa, or greater than 5000 kPa; in some embodiments, the high pressure is at most 100,000 kPa, or at most 50,000 kPa, or at most 25,000 kPa, or at most 10,000 kPa; it is contemplated that any of the foregoing pressure values can be combined to form a range of desirable high pressures. In some embodiments, the inert gas comprises a noble gas. The inert gas may comprise mixtures of two or more noble gases. Preferably the inert gas comprises helium and/or argon. Most preferably the inert atmosphere comprises argon. Preferably the inert gas comprises at least 90% by volume of noble gas based on the total volume of gas in the reaction chamber. More preferably, the inert gas comprises at least 95%, or at least 98%, or at least 99%, or at least 99.9%, or at least 99.99%, or at least 99.999%, or at least 99.9999%, wherein such percentages are by volume of noble gas based on the total volume of gas in the reaction chamber. Most preferably the noble gas is argon. Preferably the inert atmosphere around the levitation volume does not comprise oxygen. The presence of oxygen in the atmosphere is thought to speed up the rate of graphitization of the diamond. The atmosphere around the levitation volume preferably comprises less than 0.1% by volume of oxygen based on the total volume of gas in the reaction chamber. More preferably, the atmosphere around the levitation volume comprises less than 0.1%, or less than 0.05%, or less than 0.01%, or less than 0.001%, or less than 0.0001%, wherein such percentages are by volume of oxygen based on the total volume of gas.

In some embodiments, particularly when performed in microgravity, large diamond cylinders or other shapes may be grown using the continuous diamond growth method during which sections of the growing diamond materials may be continuously removed. Additionally, sections may be cut off by a laser or another high energy beam while the diamond precipitate is still being withdrawn from the liquid solvent. In other embodiments, the process may run semi-continuously in which one diamond cylinder is grown followed by the next, each starting with a seed crystal.

In some microgravity-based embodiments, materials will be transported into space and will arrive at the diamond growth facility. Once the materials arrive at the diamond growth facility, they will replenish any lost solvent, carbon source or other materials and/or consumables. After diamond cylinders or other diamond products have been successfully grown in space, the diamond products can be ferried back to the surface of the earth for post processing and sales to customers.

The present methods can also comprise preventing or reducing graphitization of precipitated diamond. It should be noted that during diamond synthesis, graphitization may occur which is defined in this context as the process by which carbon in the diamond form converts into a graphite form. In order to prevent such graphitization, one or more antigraphitization methods can be employed, including but not limited to (1) Monatomic hydrogen etching; (2) Low temperature synthesis; or (3) Dissolution of graphite.

Regarding method one above, some researchers have pointed to the role of monatomic hydrogen in the growth of diamond, especially in the CVD methods. It may be advisable to add monatomic hydrogen to the liquid via a plasma injector, or any other method, to increase purity, yields, etc. of diamond.

Regarding method two above, the activation energy required to convert from diamond carbon to graphite is essentially not present at lower temperatures. For example, the graphitization process is reported by some to not occur significantly in an inert environment below about 1500° C. (Davies, 1972). Therefore, it may be beneficial to operate at temperatures below 1500° C. to prevent any negative effects from graphitization.

Regarding method three above, it may be possible to ensure that conditions are met such that graphite dissolves into the solvent surrounding the growing diamond surface. Graphite is usually about 2 times more soluble than diamond in solution (U.S. Pat. No. 3,142,539, 1964). In the conditions near the diamond surface where carbon is supersaturated with respect to diamond growth, the graphitizing carbon may also be dissolved into the solution because the solution may be unsaturated with respect to graphite.

Accordingly, the present methods of diamond synthesis can also comprise preventing or reducing graphitization of precipitated diamond material. According to Davies, significant graphitization occurs at temperatures above 2100° C. which is likely the upper bound to the temperatures that may be used in the diamond growth zone in such a process. Additionally, temperatures that are too low may lead to homogeneous nucleation of diamond, which is undesirable for methods comprising continuous growth onto a seed diamond in microgravity. Therefore, in some embodiments, the lower bounds for temperature of the present method are the temperatures at which homogeneous nucleation occurs, and the upper bound is the temperature at which excess graphitization occurs.

The present methods are designed to be operated at low pressures. That being said, higher pressures may increase reaction rates by decreasing the energy barriers to diamond growth. Therefore, pressures may be as low as vacuum to as high as 1,000 or more atmospheres.

The liquid solvents used are likely to be metals including catalysts that are known to improve diamond growth rates from carbon supersaturated liquids. Such metals have been studied extensively (Chien-Min Sung, 1997). Careful attention will also be paid to the total carbon concentration that may be dissolved in a metal or mixture of metals in order to increase levels of supersaturation, and therefore growth rates. Additionally, careful attention will be paid to the melting points, and operating temperatures with respect to limits imposed by homogeneous nucleation and graphitization of diamond. For example, an alloy with a low melting temperature may be aluminum to allow high concentrations of carbon to be dissolved mixed with germanium, antimony, or tin to catalyze diamond growth while still maintaining a low melting temperature to prevent excess diamond graphitization. However, there are many mixes of metals that may be possible as outlined by Chien-Min Sung.

The liquid solvent for the carbon solution can be selected from a variety of materials having desirable melting points, having the capacity to dissolve desirable amounts of carbon into solution, while providing N- or P-type doping, or other desirable physical properties to the resulting diamond material. Preferred liquid solvents include liquid metals and some non-metals. As used herein the term liquid solvent includes liquid, semi-liquid and/or molten materials. It also includes mixtures of more than one element or material, including more than one metal, material, or element. It also includes alloys, and mixtures of more than one material and/or alloy and/or metal and/or element. The liquid solvent may comprise a single material, element, or alloy, or two or more materials, elements and/or alloys. In some embodiments, the element is selected from lithium (Li), sodium (Na), potassium (K), rubidium (Rb), cesium (Cs), beryllium (Be), magnesium (Mg), calcium (Ca), strontium (Sr), barium (Ba), boron (B), aluminum (Al), gallium (Ga), indium (In), titanium (Ti), carbon (C), silicon (Si), germanium (Ge), tin (Sn), lead (Pb), phosphorus (P), arsenic (As), antimony (Sb), bismuth (Bi), sulfur (S), selenium (Se), tellurium (Te), polonium (Po), scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lanthanum (La), hafnium (Hf), tantalum (Ta), tungsten (W), rhenium (Re), osmium (Os), iridium (Ir), platinum (Pt), gold (Au), mercury (Hg), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), Ytterbium (Yb), Lutetium (Lu), and mixtures of two or more thereof. More preferably, the metal comprises aluminum (Al), iridium (Ir), nickel (Ni), cobalt (Co), osmium (Os), rhodium (Rh), iron (Fe), ruthenium (Ru), technetium (Tc), manganese (Mn), palladium (Pd), rhenium (Re), platinum (Pt), molybdenum (Mo), chromium (Cr), tungsten (W), vanadium (V), niobium (Nb), tantalum (Ta), titanium (Ti), hafnium (Hf), or mixtures of two or more thereof. In some embodiments, the metal is aluminum (Al), iridium (Ir), nickel (Ni), cobalt (Co), osmium (Os), rhenium (Rh) or an alloy containing aluminum (Al), iridium (Ir), nickel (Ni), cobalt (Co), osmium (Os), or rhenium (Rh). Suitable alloys include aluminum-tin, nickel-iron, nickel-cobalt, osmium-lead, rhenium-lead alloys. Immiscible metal mixtures may be used such as lead-iron or aluminum-lead.

The liquid solvent may have a boiling point of greater than 1500° C., 1750° C., or greater than 2000° C. The liquid solvent may have a melting point of below 1500° C., more preferably below 1450° C., or below 1000° C. or below 500° C. Preferably, in order to provide a liquid solvent saturated with dissolved carbon, the metal or other solvent is heated to a temperature of at least 800° C., or at least 1000° C., or at least 1200° C., or at least 1350° C., or at least 1500° C., or at least 1600° C., or at least 1800° C.; in some embodiments, the metal or other solvent is heated to a temperature of at most 3000° C., or at most 2500° C., or at most 2000° C., or at most 1850° C., or at most 1750° C., or at most 1650° C.; it is contemplated that any of the foregoing temperatures can be combined to form a desirable range, so long as the minimum for the range is less than its maximum. In some embodiments of the present methods and apparatus, the carbon solution or the levitation volume may have a temperature difference between different zones (e.g., between the dissolution zone and the diamond growth zone in a continuous process) or between different time periods (e.g., between a dissolution period and a diamond growth period in a batch process). Preferably, in a diamond growth zone or period, the temperature of the carbon solution is less than the temperature in the dissolution zone or period by a suitable amount, for example, by at least 5° C., or at least 25° C., or at least 50° C., or at least 75° C., or at least 100° C., or at least 125° C., or at least 150° C.; in some embodiments, the temperature difference is at most 1500° C., or at most 1000° C., or at most 500° C., or at most 400° C., or at most 325° C., or at most 250° C., or at most 200° C., or at most 175° C.; it is contemplated that any of the foregoing temperatures can be combined to form a desirable range. In general, the temperature differences between zones or periods should be selected such that the liquid solvent is saturated with carbon with respect to diamond precipitation at the coolest area or time period of the liquid solvent.

In some embodiments, the present methods comprise positioning a levitation volume (or a facility containing a levitation volume or the levitation apparatus described herein) in space relative to earth. While in space, a manufacturing facility orbiting the earth is in free fall, the magnitude of gravity near the earth side of the facility will have slightly higher gravity than the outer space facing side of the facility; there is some gravity, but so small it is almost unnoticeable. Therefore, in some embodiments, it may be beneficial to place the colder, denser diamond growth zone of the carbon solution on the earth side where gravity is greater, and the hotter, less dense carbon dissolution zone may face outer space. However, such an effect may prove to be negligible in the microgravity conditions of space.

In some embodiments, the levitation generators comprise one or more electromagnetic pumps. An electromagnetic pump is a pump that moves liquid metal (or any electrically conductive liquid) using electromagnetism. A magnetic field is set at right angles to the direction the liquid moves in, and a current is passed through it. This causes an electromagnetic force that moves the liquid. An electromagnetic coil is positioned with respect to the levitation volume so that the field lines are positioned appropriately. DC voltage is then applied to both the electrodes and electromagnet using a controlled power supply. This can be used to move or position the levitating solvent as desired.

Figure 6:
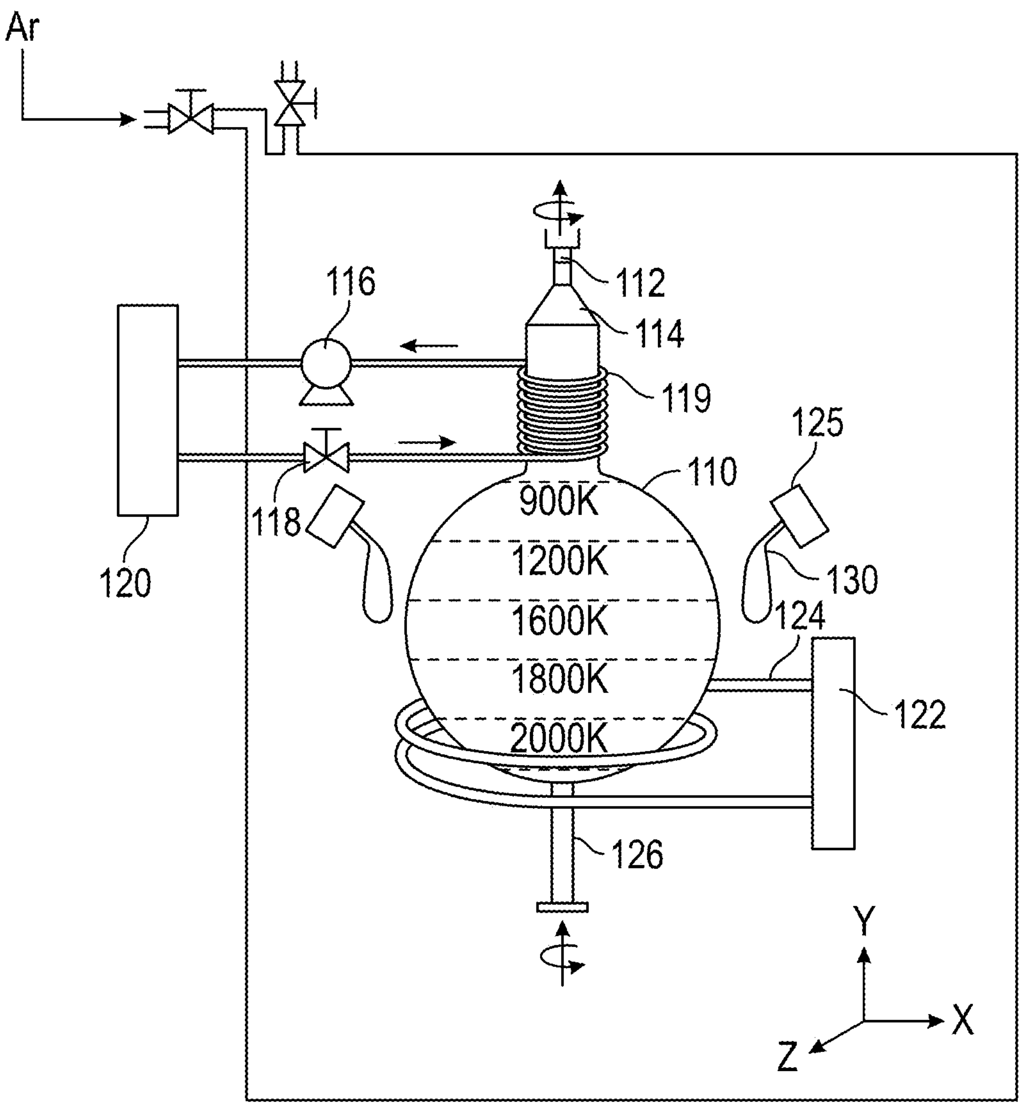
FIG. 6 shows an embodiment of the present apparatus suitable for operation in outer space, where levitation is low cost for large liquids.

FIG. 6 illustrates an embodiment of the present apparatus which is especially suitable for performing a continuous diamond synthesis method in microgravity. In general, carbon is dissolved in the hotter dissolution zone of a levitated liquid solvent and a diamond cylinder is pulled out the other end of the liquid solvent. A heat exchanger removes heat from the diamond cylinder while radiative heating coils heat the dissolution zone. Positioning and confinement of the liquid is performed by levitation generators.

More particularly, a diamond seed 112 was previously introduced to a diamond growth zone of the levitated liquid solvent 110, and the diamond seed 112 initiated diamond precipitation from the carbon supersaturated liquid solvent 110. In FIG. 6, a diamond cylinder 114 is being pulled and rotated as it grows on the cold, growth zone of the liquid solvent 110. A heat exchanger 120 removes heat from the growing diamond cylinder 114 and releases it to an external system. A pump 116 is used to circulate a heat exchange fluid from the heat exchanger 120 through heat exchange conduits 119 that is cooling the growing diamond cylinder as heat is released radiatively upon formation of diamond from the liquid solution. A valve 118 controls pressure of cooling fluid as desired. In some embodiments, the valve 118 is operated so that the cooling fluid is at a higher pressure in the heat exchanger 120, and a lower pressure in the exchange conduits 119 around the growing diamond cylinder. A power source 122 adds heat into the dissolution zone through the radiative heating coils 124. Radiative heating coils 124 of nichrome or another resistive material heat up from the electric currents from the power source 122. The radiative heating coils 124 then transfer the heat radiatively to the dissolution zone of the liquid solvent 110. Radiative heating coils 124 are used instead of induction coils for heating to prevent a large Lorentz force on the levitation volume. A large Lorentz force could create convection within the levitation volume. Such convection could prevent the distinction between a dissolution zone and a growth zone with different temperatures and compositions. This is because convection from the Lorentz force may mix the entire levitation volume so that an only approximately homogenous temperature and composition exists. A carbon source 126 is continuously rotated and pushed into the dissolution zone of the levitating liquid solvent 110. While only very small positioning forces are required in the microgravity of space, a power source 125 provides alternating electric current to induction coils 130 meant for positioning the levitating liquid ball. Induction coils 130 are operated to provide Lorentz forces in the +/−x, y, and z directions in this case by induction coils opposing each other as shown in the x direction, but also present (but not shown) in the y and z directions. Note that only the two opposing coils 130 providing net +/− force in the x directions are shown for simplicity, but the present method and apparatus can include 4, 6, 8, 12 or more opposing coils. The induction coils will be operated with low currents and low frequencies to prevent large Lorentz forces inducing convection and/or significant heating from resistance to the flow of induced electric current.

Figure 7:
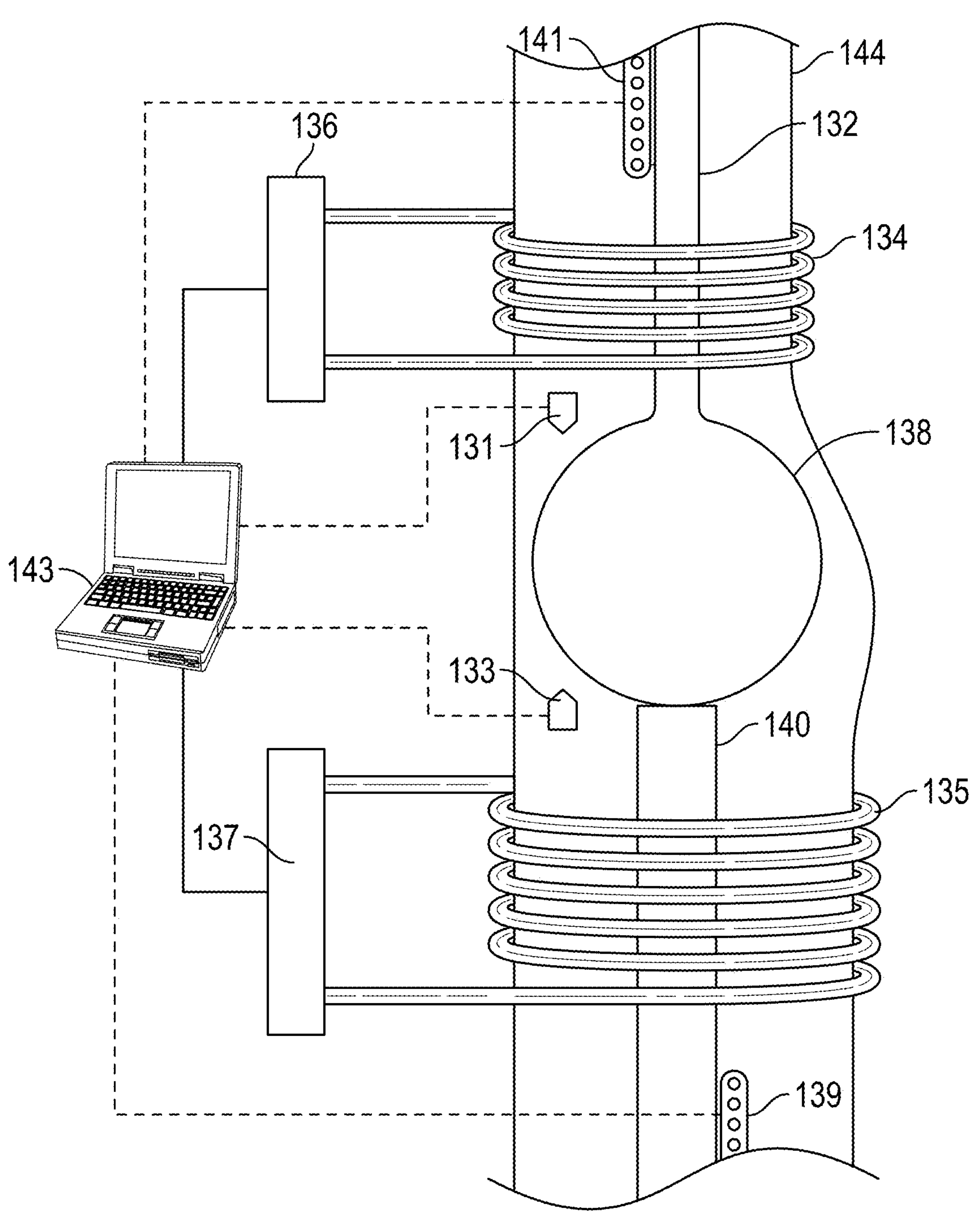
FIG. 7 shows an embodiment of the present apparatus suitable for its use in an earthbound diamond growth process.

FIG. 7 illustrates an embodiment of the present apparatus wherein both levitation and melting are provided by induction coils. In general, a carbon source is inserted below the liquid solvent to saturate it with dissolved carbon, and once cooled, the diamond seed is inserted from above to initiate diamond precipitation. The growing diamond is then removed and the process then repeats over and over until the preferred diamond size is achieved.

More particularly, a diamond cylinder 132 grows from the carbon supersaturated liquid 138 levitated within a levitation volume. Induction coils 134, 135 inductively generate heat within the liquid and provide levitation, thereby acting as levitation force generators. The relative amount of heat versus levitation forces can be controlled by adjusting the amplitude of the current supplied, and the frequency at which it is alternated. Higher amplitudes of current correspond to higher amplitudes of induced current and magnetic fields. Therefore, higher amplitudes of current correspond to higher Lorentz forces. However, higher frequencies may be used to provide more inductive heating to the liquid 138. Power sources 136, 137 provide the desired current to the induction coils 134, 135. The apparatus also includes temperature control devices in the form of thermocouples 131, 133 which provide a temperature signal for the levitation volume or a zone thereof. The temperature signal can be used to adjust the current supplied to the coils 134, 135. A levitating liquid solvent 138 provides the supersaturated carbon to the surface of the growing diamond. Due to the convective mixing effects of gravity on earth and the Lorentz force, the levitated liquid solvent remains at approximately one temperature rather than a gradient from a dissolution zone to a growth zone. Carbon source 140 is introduced to the liquid solvent when the liquid solvent is hot, thereby forming a carbon solution. The apparatus can also include a device for feeding the carbon source 140 to the carbon solution 138, such as a conveyer 139. Once saturated with dissolved carbon, the carbon solution is then cooled to induce supersaturation. A tube 144 or other container isolates the liquid's environment which is kept as a pure argon environment to improve purity. The apparatus can also include a device for withdrawing the diamond cylinder 132 from the carbon solution, such as a conveyer 141. A controller 143 such as a computer can be in signal communication with the power sources 136, 137, and with other components of the apparatus, such as the thermocouples 131, 133, and conveyors 139, 141.

Figure 8:
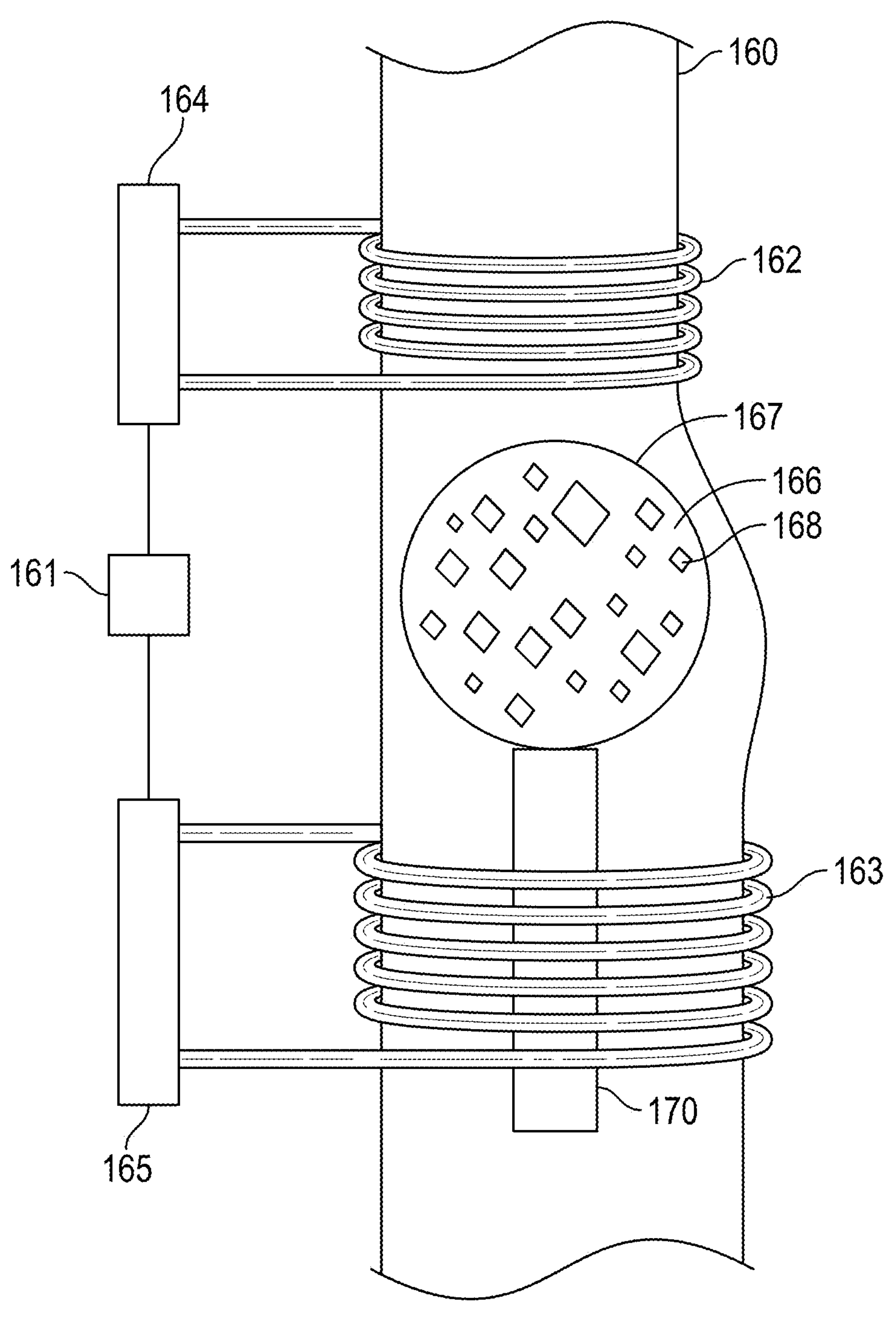
FIG. 8 shows an embodiment of an earthbound process for homogeneous nucleation of diamond using a levitating supersaturated liquid.

FIG. 8 illustrates a method and apparatus in which a solvent is levitated using electromagnetic levitation to offset the gravitational force, and inductive heating using the same coils is used to increase temperature of the liquid solvent. Then, carbon is dissolved into the liquid solvent. Temperature is then decreased so that the carbon solution becomes supersaturated in carbon with respect to homogeneous diamond nucleation, inducing the nucleation (generation) and growth of diamond nuclei from the bulk solution. Depending on the size required, the diamond growth may be stopped before the carbon content has been exhausted, or the liquid could go through multiple cycles, taking care to avoid completely dissolving the already-grown diamonds.

Figure 9:
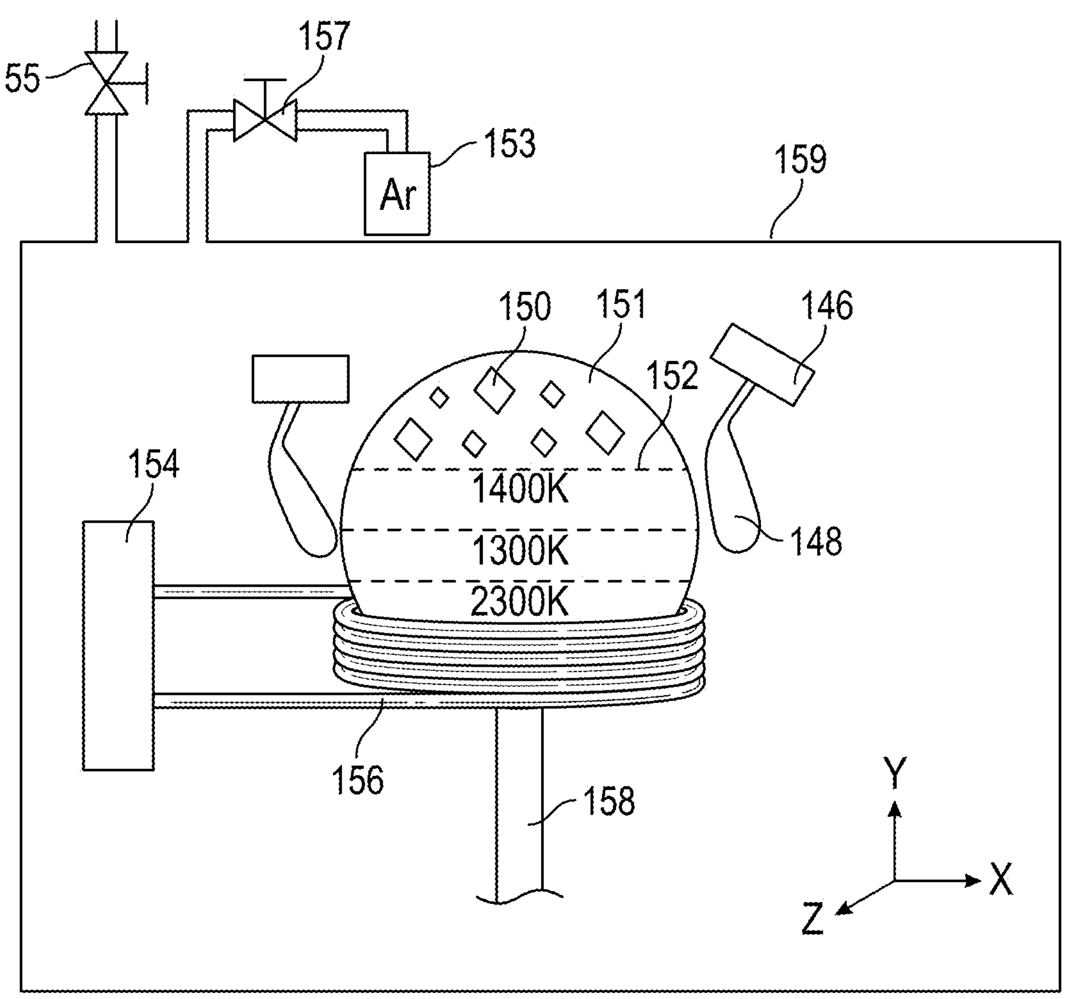
FIG. 9 shows how the process of homogeneous nucleation may be used to grow diamonds within the microgravity of space.

More specifically, the apparatus of FIG. 8 comprises a tube 160 configured to contain the atmosphere around the levitation volume, and the tube 160 may be supplied with an inert gas like argon. The apparatus includes two levitation generators at opposite ends of the levitation volume 167. Each of the levitation generators includes an induction coil and a power source. Induction coils 162, 163 are used to provide levitation and heating to the liquid solvent. Power source 164, 165 are controlled by a controller 161 and supply current to the induction coils 162, 163. The liquid solvent 166, upon cooling, becomes supersaturated with carbon with respect to homogeneous diamond nucleation, forming diamond material 168. Upon supersaturation with respect to homogeneous diamond nucleation, diamonds may nucleate and grow in the bulk solution. In some embodiments, instead of diamonds growing directly from nucleation followed by growth, diamond seed crystals are inserted into the liquid solvent. When the liquid solvent is at a hotter temperature, carbon is dissolved into the liquid from a carbon source 170. FIG. 9 illustrates a process and apparatus in which diamonds are growing from the carbon-supersaturated liquid with respect to homogeneous diamond nucleation. This embodiment of the present method may utilize continuous processing, if carried out in the microgravity of space, where carbon is introduced on the bottom of the levitation volume comprising liquid solvent and a temperature gradient is maintained in the liquid solvent to induce carbon supersaturation with respect to homogeneous diamond nucleation. Therefore, where temperature in the liquid solvent reaches a low enough value, diamond will nucleate and grow from the solution. Temperature in the dissolution zone may be maintained using radiative heating. Positioning in the x, y, and z directions may be maintained using induction coils.

Liquid solvent 151 is supersaturated with carbon with respect to homogeneous diamond nucleation and/or growth. Temperature 152 at which homogeneous diamond nucleation and/or growth occurs. This temperature will depend on many factors and is variable to change. Argon tank 153 to provide argon atmosphere to the chamber is controlled by valve 157. Power supply 154 provides electric current to radiative heating coils. Valve 155 to evacuate chamber to outer space if necessary or in startup of the process. Radiative heating coils 156 providing heat to the dissolution zone. Carbon source 158 is dissolved into the liquid continuously while spinning to increase dissolution rates. An argon atmosphere is created by flowing argon into the chamber 159. A power supply 146 supplies alternating current to opposing induction coils 148 similar to 125 and 130 in FIG. 6.

Material for Microelectronics

In some embodiments, a diamond material may be made for use in the microelectronics industry as a substrate wafer for building electronic circuits. The easiest way to make these wafers will be to slice the diamond cylinder into wafers, preferably with a laser. However, the diamond cylinders we attain from space may have impurities from the solvent, or any gasses in the chamber at the time of growth. So, such diamond material may not be sufficiently pure for use as base material for transistors in a microchip, or other applications. However, this diamond wafer may serve as a substrate for growing a high purity diamond film using the known microwave plasma CVD method. The main advantage of using the present process to make large diamond substrates is that no other known synthetic process has produced large diamonds economically. The diamond wafer will have the thermal conductivity required to remove heat from the transistors. And, once a thin layer of high purity CVD diamond is added on top of the diamond wafer, the resulting diamond film will be of sufficient quality for making diamond transistors.

Figure 10:
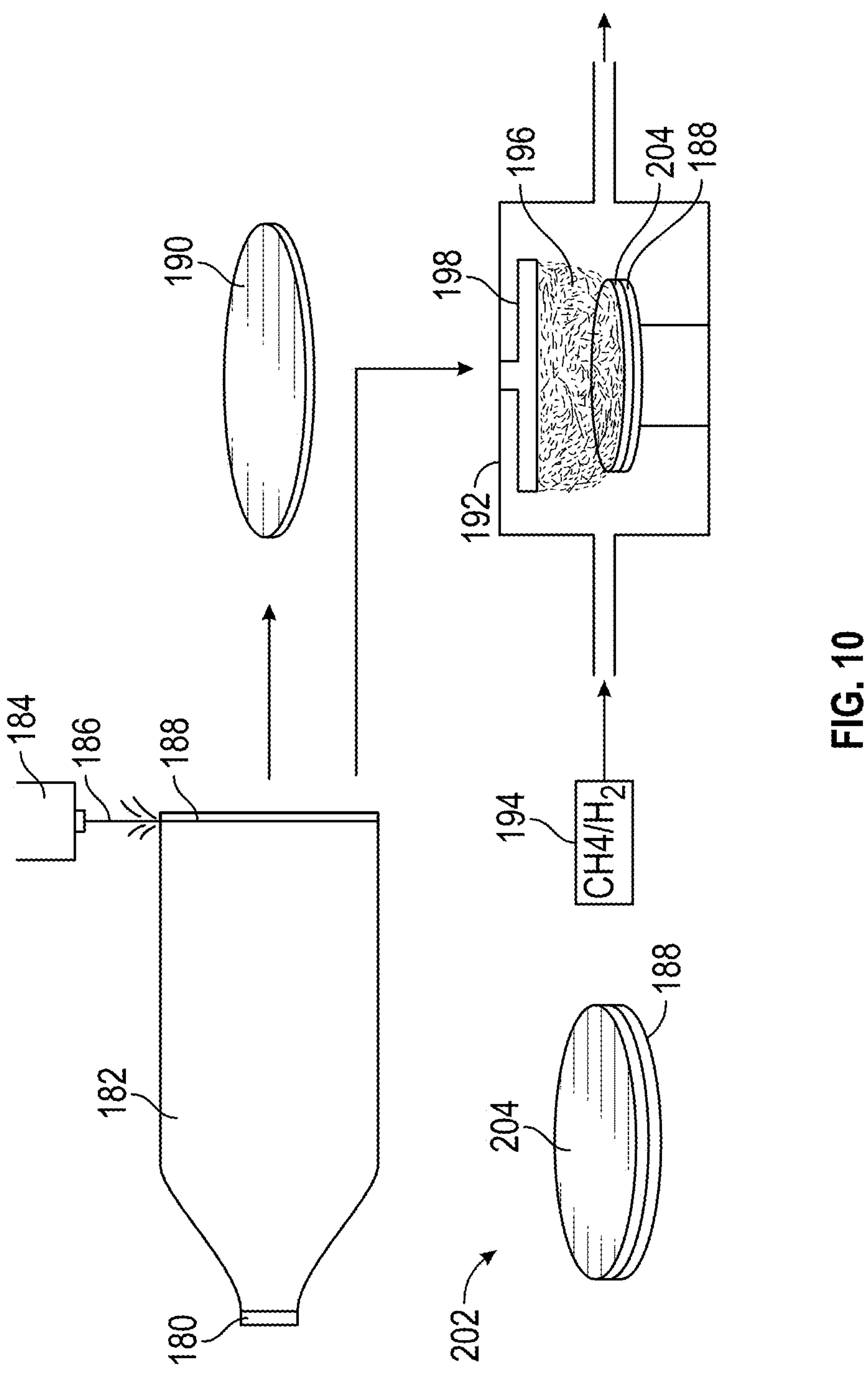
FIG. 10 outlines a process for synthesizing a diamond material suitable for use as a substrate in the microelectronics industry.

FIG. 10 illustrates a process and system for synthesizing a diamond material suitable for use in microelectronics manufacturing. A diamond seed 180 is used according to the any of the methods described herein to grow a diamond cylinder 182 from a levitating liquid solvent. A laser source 184 provides a laser 186 having sufficient cutting power for slicing diamond, and the laser 186 is used to cut discs 188 from the diamond cylinder 182. The process and materials are not limited to cylindrical shapes, and thin layers can be cut by a laser from any diamond material grown from the levitated solution process.

These discs 188 may be pure enough for use directly as wafer 190 in the microelectronics industry, such as to form transistors or microelectronic components. Alternatively, further post-processing may be employed on the discs 188 to provide a material having greater purity. For instance, a disc 188 can be used as a first wafer layer, which is then processed by applying a thin film of high purity diamond 204 on one or more surfaces of the disc 188. The thin film of diamond can be applied by chemical vapor deposition (CVD) or other technique. In FIG. 10, a disc 188 in placed in a vacuum chamber 192 and subjected to a microwave plasma CVD process. A charged plate 198 may be used to create the plasma 196. The carbon source 194 for the CVD process may be methane, and hydrogen can also be supplied to fine tune the monatomic hydrogen to carbon ratio in the plasma. Hydrogen prevents unwanted graphite, and if tuned properly, will lead to monocrystalline rather than polycrystalline diamond growth. In FIG. 10, a plasma 196 of carbon and hydrogen radicals forms above the diamond wafer layer 188. A power source 198 provides the power for producing the microwave plasma. Pure diamond grows on a top surface 204 of the disc 188, thereby forming a bilayer diamond wafer 202 comprising the disc 188 grown from the levitated solution process as a first diamond wafer layer, and a new diamond layer 204 comprising CVD-synthesized diamond as a second diamond wafer layer, which is sufficiently pure for microelectronics manufacturing. In some embodiments, the bilayer diamond wafer comprises a first diamond wafer layer having a thickness in a range of 100-1,000 μm, and a second diamond wafer layer having a thickness in a range of 1-100 μm or more.

Diamond Cylinder Applications

The diamond cylinders produced in the continuous diamond synthesis methods described herein may be used in many applications including high wear, jewelry, optical components, abrasives, biomaterials, chemical sensing, or heat exchangers among others. A significant improvement between the diamond materials made according to the present disclosure and others currently on the market is based on its size and cost. Before the present synthetic methods, diamonds greater than 16 mm had not been synthesized. The present methods will also allow lower cost production of such diamonds because the process can be performed continuously at a low pressure and with high growth rates, all of which decrease costs of the final product.

Homogeneous Nucleation Diamond

While the present method of microgravity manufacturing to produce a diamond cylinder is highly advantageous, as it produces diamond for the lowest cost, it may also be desirable in some applications to make diamond powders or larger crystals through homogeneous nucleation and/or growth. Such diamonds may especially be useful in abrasive applications.

Crystalline Structure

In various embodiments of the diamond precipitate (cylinder, powder, octahedron, etc.), the diamond produced may be monocrystalline or polycrystalline. Processing conditions e.g. solvent composition, temperatures, pressures, and supersaturations may be tailored to selectively favor one or the other. Each will have different physical and chemical properties. However, each will also have high value in many industries.

Various other embodiments of apparatus encompassed by the present disclosure may include combinations of features from different embodiments described above. Various embodiments of the methods encompassed by the present disclosure may include combinations of features from different embodiments described above.

BIBLIOGRAPHY

All patents and publications referred to herein are expressly incorporated by reference.

ALTR. (2018, May 31st). *Created Diamonds*. Retrieved from ALTR: https://www.altr.nyc/created-diamonds/

Banerjee, A. (2018). Ultralarge Elastic Deformation of Nanoscale Diamond. *Materials Science,* 300-302.

Brinkman, J. A. (1964). U.S. Pat. No. 3,142,539.

Brinkman, J. A. (1965). U.S. Pat. No. 3,175,885.

Burton, C. V. (1905). Artificial Diamonds. Nature, 397.

Catledge, S. (2013). Nanostructured Diamond Coatings for Orthopaedic Applications. Woodhead Publishing Limited.

Chien-Min Sung. (1997). Reactivities of Transition Metals with Carbon: Implications to the Mechanism of Diamond Synthesis Under High Pressure. International Journal of Refractory Metals and Hard Materials, 237-256.

CVD/HPHT Polished Loose Synthetic Diamonds, Lab Grown Diamond. (2020). Retrieved from Alibaba:

https://www.alibaba.com/product-detail/CVD-HPHT-Polished-Loose-Synthetic-Diamonds 60631391501.html Eaton-Magalia, S. (2017). Observations on HPHT-Grown Synthetic Diamonds: A Review. Gems & Gemology, 262-284. Retrieved from Gemological Institute of America: https://www.gia.edu/gems-gemology/fall-2017-observations-hpht-grown-synthetic-diamonds Element Six Technologies. (2015, 02 16). *THE ELEMENT SIX CVD DIAMOND HANDBOOK*. Retrieved from Element Six: https://e6cvd.com/media/wysiwyg/pdf/E6 CVD Diamond Handbook.pdf Glebovsky, V. (2020). Electromagnetic Levitation of Metal Melts, *Open access peer-reviewed chapter*, DOI: 10.5772/intechopen.92230

Hassan, S. (2010). Limitation of Silicon Based Computation and Future Prospects. *Second International Conference on Communication Software and Networks* (*pp.* 559-561). IEEE.

Kawasaki, K. (2006). U.S. Pat. No. 7,061,964.

Li, G. X. (2005). Scaling law for Diffusion Coefficients in Simple Melts. Physical Review, 094209.

Moynihan, P. (1990). U.S. Pat. No. 4,896,849.

Nakatani, I. (1995). U.S. Pat. No. 5,476,063.

Patel, A. (1979). Overgrowths on Diamond at Atmospheric Pressure. *Journal of Crystal Growth,* 706-708.

Rapaport News. (2020, November 26). Lab Grades its Largest CVD Diamond. Retrieved from Rapaport: https://www.diamonds.net/News/NewsItem.aspx?ArticleID=65787&ArticleTitle=Lab+Grades+Its+Largest+CVD+Diamond#:~:text=The%20International%20Gemological%20Institute's%20(IGI,IIa %2C %20the%20IGI%20said%20Monday.

Roy, R. (2002). U.S. Pat. No. 6,342,195.

Sally-Eaton Magalia. (2018). 15 Carat HPHT Synthetic Diamond. Gems & Gemology, 217-218.

Shearwood, C. (1999). U.S. Pat. No. 5,955,800.

Slack, G. A. (1964). Thermal Conductivity of Pure and Impure Silicon, Silicon Carbide, and Diamond. *Journal of Applied Physics,* 3460-3466.

Stoneham, A. M. (2016). U.S. Pat. No. 9,346,681.

Ulrika F. S. D'Haenens-Johansson. (2014). Near-Colorless HPHT Synthetic Diamonds from AOTC Group. Gems & Gemology, 30-45.

Volfson, L. (2019). US Patent App. Pub. No. 20190152835.

Wang, X. (2005, October 25). Carbon Phase Diagram from Ab Initio Molecular Dynamics. Physical Review Letters, 185701. Retrieved from https://doi.org/10.1103/PhysRevLett.95.185701

Yolshina, L. (2015). Diamond Synthesis in Aluminum Matrix in Molten Alkali-Halide at Ambient Pressure. Diamond and Related Materials, 1-11.

Exemplary Embodiments

Exemplary embodiments provided in accordance with the presently disclosed subject matter include, but are not limited to, the following:

Embodiment 1. A method of synthesizing diamond, the method comprising levitating a carbon solution comprising dissolved carbon and liquid solvent; controlling the temperature of the carbon solution so that the liquid solvent becomes saturated or supersaturated with the dissolved carbon; and precipitating the dissolved carbon from the liquid solvent to form a diamond precipitate.

Embodiment 2. The method of embodiment 1, wherein the carbon solution comprises a dissolution zone and a diamond growth zone, and the method further comprises diffusing the dissolved carbon from the dissolution zone to the diamond growth zone; and controlling temperature of the carbon solution in the diamond growth zone so that it is lower than the temperature of the carbon solution in the dissolution zone, wherein the liquid solvent in the growth zone becomes saturated or supersaturated with the dissolved carbon.

Embodiment 3. The method of embodiment 1 or 2, wherein the carbon solution is levitated in a microgravity environment.

Embodiment 4. The method of any of embodiments 1 to 3, further comprising applying a levitating force from one or more levitation generators.

Embodiment 5. The method of any of embodiments 1 to 4, wherein the carbon solution is levitated in microgravity environment, and the levitation generators are configured to confine the carbon solution within a levitation volume.

Embodiment 6. The method of any of the foregoing embodiments, wherein the carbon solution is levitated by acoustic, aerodynamic, or Lorentz forces.

Embodiment 7. The method of any of the foregoing embodiments, wherein a carbon source is continuously introduced into the liquid solvent in the dissolution zone while the liquid solvent is levitating.

Embodiment 8. The method of embodiment 7, wherein the diamond precipitate is continuously recovered from the diamond growth zone.

Embodiment 9. The method according to any of the foregoing embodiments, further comprising inserting a seed diamond at a liquid solvent surface in the diamond growth zone, and precipitating the dissolved carbon onto the seed diamond.

Embodiment 10. The method of any of the foregoing embodiments, further comprising forming the carbon solution by placing a metal solvent in solid form in a levitation volume; applying electromagnetic induction to melt and levitate the metal solvent; and introducing the carbon source to the molten metal solvent.

Embodiment 11. The method of any of embodiments 1 to 9, further comprising forming the carbon solution by placing a metal solvent in solid form in a levitation volume; applying radiative heating to melt, and electromagnetic induction to levitate the metal solvent; and introducing the carbon source to the molten metal solvent.

Embodiment 12. The method of any of the foregoing embodiments, wherein the method further comprises completely immersing a seed diamond in the levitated carbon solution; and removing the inserted seed diamond from the levitated carbon solution after initiation of diamond growth.

Embodiment 13. The method of any of embodiments 1 to 8 or 10 to 11, wherein no seed diamond is inserted into the solvent, and the diamond precipitate homogeneously nucleates and grows.

Embodiment 14. The method of any of embodiments 1 to 7 or 9 to 13, wherein a batch operation is performed by heating and saturating the carbon solution, followed by cooling the carbon solution to supersaturate the carbon solution and precipitate diamond material.

Embodiment 15. An apparatus for synthesizing diamond from a levitating carbon solution comprising dissolved carbon in a liquid solvent, the apparatus comprising a levitation generator configured to apply levitating forces, wherein the applied levitating forces define a levitation volume; and a temperature control device configured to adjust a temperature of the levitation volume.

Embodiment 16. The apparatus of embodiment 15, wherein the levitation volume comprises a dissolution zone and a diamond growth zone.

Embodiment 17. The apparatus of embodiment 15 or 16, wherein the levitation generator is a Lorentz force generator, an acoustic force generator, or an aerodynamic force generator.

Embodiment 18. The apparatus of any of embodiments 15 to 17, wherein the levitation generator comprises at least three pairs of said levitation generators, with said pairs positioned on three mutually perpendicular axes.

Embodiment 19. The apparatus of any of embodiments 15 to 18, wherein the temperature control device comprises a sensor that senses the temperature of the levitation volume, and a controller that adjusts the levitation generator or a heater or cooler.

Embodiment 20. The apparatus of any of embodiments 15 to 19, wherein the temperature control device comprises a heat exchanger or other device that controls the temperature of the growth zone or growing diamond cylinder.

Embodiment 21. The apparatus of any of embodiments 15 to 20, wherein the temperature control device comprises a heat exchanger, or other device that controls the temperature of the dissolution zone and/or the growing diamond cylinder.

Embodiment 22. The apparatus of any of embodiments 15 to 21, further comprising a carbon source feed device positioned at an end of the dissolution zone.

Embodiment 23. The apparatus of any of embodiments 15 to 22, further comprising a diamond withdrawal device positioned at an end of the diamond growth zone.

Embodiment 24. A system for manufacturing diamond wafers comprising the diamond synthesizing apparatus of embodiment 23; and a cutting laser positioned to slice wafers from a diamond precipitate recovered from the diamond growth zone.

Embodiment 25. A diamond cylinder having a diameter and a length, wherein the length is greater than 16 mm.

Embodiment 26. A method of preparing a bilayer diamond wafer, the method comprising forming a first diamond layer by cutting a wafer from the diamond cylinder of embodiment 25, wherein the wafer has a thickness of 100 to 1000 μm; forming a second diamond layer on a surface of the wafer, wherein the second diamond layer has greater purity than the first diamond layer.

In view of this disclosure it is noted that the present methods and apparatus can be implemented in keeping with the present teachings. Further, the various components, materials, structures and parameters are included by way of illustration and example only and not in any limiting sense. In view of this disclosure, the present teachings can be implemented in other applications and components, materials, structures and equipment to implement these applications can be determined, while remaining within the scope of the appended claims.

What is claimed is:

1. A method of synthesizing diamond, the method comprising;

levitating a carbon solution comprising dissolved carbon and liquid solvent;

controlling the temperature of the carbon solution so that the liquid solvent becomes saturated or supersaturated with the dissolved carbon; and precipitating the dissolved carbon from the liquid solvent to form a diamond precipitate.

2. The method of claim 1, wherein the carbon solution comprises a dissolution zone and a diamond growth zone, and the method further comprises:

diffusing the dissolved carbon from the dissolution zone to the diamond growth zone; and comprises controlling temperature of the carbon solution in the diamond growth zone so that it is lower than the temperature of the carbon solution in the dissolution zone, wherein the liquid solvent in the growth zone becomes saturated or supersaturated with the dissolved carbon.

3. The method of claim 1, wherein the carbon solution is levitated in a microgravity environment.

4. The method of claim 1, further comprising applying a levitating force from one or more levitation generators.

5. The method of claim 4, wherein the levitation generators are configured to confine the carbon solution within a levitation volume.

6. The method of claim 1, wherein the carbon solution is levitated by acoustic, aerodynamic, or Lorentz forces.

7. The method of claim 1, wherein a carbon source is continuously introduced into the liquid solvent in a dissolution zone while the liquid solvent is levitating.

8. The method of claim 7, wherein the diamond precipitate is continuously recovered from a diamond growth zone.

9. The method according to claim 1, further comprising inserting a seed diamond at a liquid solvent surface in a diamond growth zone, and precipitating the dissolved carbon onto the seed diamond.

10. The method of claim 1, further comprising forming the carbon solution by:

placing a metal solvent in solid form in a levitation volume;

applying electromagnetic induction to melt and levitate the metal solvent; and introducing a carbon source to the molten metal solvent.

11. The method of claim 1, further comprising forming the carbon solution by:

placing a metal solvent in solid form in a levitation volume;

applying radiative heating to melt, and electromagnetic induction to levitate the metal solvent; and introducing a carbon source to the molten metal solvent.

12. The method of claim 1, wherein the method further comprises:

completely immersing a seed diamond in the levitated carbon solution; and removing the inserted seed diamond from the levitated carbon solution after initiation of diamond growth.

13. The method of claim 1, wherein no seed diamond is inserted into the liquid solvent, and the diamond precipitate homogeneously nucleates and grows.

14. The method of claim 1, wherein a batch operation is performed by heating and saturating the carbon solution, followed by cooling the carbon solution to supersaturate the carbon solution and precipitate the diamond material.

15. The method of claim 1, further comprising adding monatomic hydrogen to the liquid solvent.

16. The method of claim 1, wherein the liquid solvent has a melting point of below 1500° C.

17. An apparatus for synthesizing diamond from a levitating carbon solution comprising dissolved carbon in a liquid solvent, the apparatus comprising:

a levitation generator configured to apply levitating forces to the liquid solvent, wherein the applied levitating forces define a levitation volume;

a carbon source feed device at an end of the levitation volume; and a temperature control device configured to adjust a temperature of the levitation volume.

18. The apparatus of claim 17, wherein the levitation volume comprises a dissolution zone.

19. The apparatus of claim 17, wherein the levitation generator is a Lorentz force generator, an acoustic force generator, or an aerodynamic force generator.

20. The apparatus of claim 17, wherein the levitation generator comprises at least three pairs of said levitation generators, with said pairs positioned on three mutually perpendicular axes.

21. The apparatus of claim 17, wherein the temperature control device comprises a sensor that senses the temperature of the levitation volume, and a controller that adjusts the levitation generator or a heater or cooler.

22. The apparatus of claim 17, wherein the temperature control device comprises a heat exchanger or other device that controls the temperature of a growth zone or a growing diamond.

* * * * *